(12) United States Patent
Lopez

(10) Patent No.: US 10,027,047 B1
(45) Date of Patent: Jul. 17, 2018

(54) SELF CLEANING SLOTTED ELECTRICAL CONTACT DEVICE FOR SEMICONDUCTOR CONTACTS

(71) Applicant: Jose E. Lopez, Sunnyvale, CA (US)

(72) Inventor: Jose E. Lopez, Sunnyvale, CA (US)

( * ) Notice: Subject to any disclaimer, the term of this patent is extended or adjusted under 35 U.S.C. 154(b) by 0 days.

(21) Appl. No.: 15/651,001

(22) Filed: Jul. 17, 2017

(51) Int. Cl.
| H01R 12/91 | (2011.01) |
| H01R 12/71 | (2011.01) |
| H01R 13/24 | (2006.01) |
| H01L 23/482 | (2006.01) |

(52) U.S. Cl.
CPC .......... *H01R 12/91* (2013.01); *H01L 23/482* (2013.01); *H01R 12/714* (2013.01); *H01R 12/716* (2013.01); *H01R 13/24* (2013.01)

(58) Field of Classification Search
CPC ..... H01R 12/91; H01R 12/714; H01R 12/716
USPC .......................................... 439/66, 700, 824
See application file for complete search history.

(56) References Cited

U.S. PATENT DOCUMENTS

| 6,663,439 | B2* | 12/2003 | Henry | H01R 13/2421 439/700 |
| 7,300,288 | B1* | 11/2007 | Chen | H01R 13/2421 439/654 |
| 7,467,952 | B2* | 12/2008 | Hsiao | H01R 13/2421 439/66 |
| 7,507,110 | B1* | 3/2009 | Yin | G01R 1/06722 439/482 |
| 7,559,769 | B2* | 7/2009 | Hsiao | H05K 7/1069 439/66 |
| 8,182,298 | B1* | 5/2012 | Lin | H01R 13/2421 439/816 |
| 8,441,275 | B1* | 5/2013 | Alladio | G01R 1/0466 324/756.01 |
| 8,926,376 | B2* | 1/2015 | Mori | H01R 13/2421 439/482 |
| 9,088,083 | B2* | 7/2015 | Mason | H05K 7/1069 |
| 9,431,742 | B2* | 8/2016 | DiFonzo | H01R 13/17 |
| 9,601,848 | B2* | 3/2017 | Heppner | H01R 12/7076 |
| 2016/0285188 | A1* | 9/2016 | Mori | H01R 13/2421 |
| 2016/0308297 | A1* | 10/2016 | Sato | H01R 13/2421 |
| 2017/0093071 | A1* | 3/2017 | DiFonzo | H01R 13/2421 |

* cited by examiner

*Primary Examiner* — Edwin A. Leon
*Assistant Examiner* — Oscar Jimenez

(57) ABSTRACT

An electrical contact device having a housing with a square or rectangular hole formed within first and second crossing channels that extends laterally from the hole. A conductive first contact element fits into the hole, while a second contact element fits onto the top opening of the first contact element. The primary and secondary contact elements have flange protrusions that overlap. In addition, the second contact element has a tail with an oblique surface facing the top of a compliant uniform rod and the proximate primary or secondary protrusion of the first contact element. A compliant rod is positioned between the first contact element's primary and secondary protrusions, such that when the first contact element is positioned over a fixed surface and the second contact element is pushed downward when an inward force is applied, the second contact element's external contact surface slides laterally.

12 Claims, 5 Drawing Sheets

SELF CLEANING SLOTTED ELECTRICAL CONTACT DEVICE FOR SEMICONDUCTOR CONTACTS

BACKGROUND OF THE INVENTION

The objective of this invention is to propose a method of contacting that maintains a reliable method of electrical contact between the leads of a semiconductor device and the terminals of a printed circuit board or load board so that the resistance is maintained low, minimal housing bow, vertical alignment of the device leads to the load board and no wear of the load board.

A major instability in contact resistance is in the mate between the contact tip and the device lead after both surfaces have merged. One method to overcome this instability is by designing a contact tip that is spiked to break through the debris on the surface of the device leads. The other common method is to have the contact tip translate along the device lead to create a self-cleaning action between the device lead and the contact tip. While the former method is initially effective it is still subject to debris accumulation and contact tip wear, both of which will result in increased resistance.

SUMMARY OF THE INVENTION

The invention consists of housing that is generally insulative such as plastic with a first surface that is usually placed into engagement with the surface of a load board. The housing has a second surface that is generally parallel to and spaced from the housing's first surface. The second surface is opposite facing the first surface and usually placed into engagement with the leads of a device. The housing has a first channel that extends from the first surface to about halfway into the housing and opens onto the first surface. In addition, the housing has a second channel crosswise from the first channel, that extends from the second surface to about halfway into housing and opens onto the second surface. The first and second channel's depth of cut into the housing is such that a square or rectangular hole is produced where they meet.

A first contact element made of conductive material with a base that fits into the hole forming part of the bottom of the first channel, proximate the first surface. The said first contact element has a primary protrusion, directed inward, generally perpendicular to the base and parallel to the proximate wall of the slot. Furthermore, the first contact element's base has a secondary protrusion that originates from the opposite end of the base, extending parallel to the primary protrusion and parallel to the respective proximate wall of the slot. The ends of the primary and secondary protrusions both have inward flanges that function as retention features for the second contact element to be further discussed.

There is a second contact element made of conductive material generally shaped similar to a bar with a generally trapezoidal tail that fits into primary and secondary protrusions of the first contact element, proximate the second surface. The lower tail portion of the said second contact element has outward flanges that generally mates into the respective flanges of the first contact element to function as a retention feature for the second contact element. Furthermore, the second contact element has an oblique surface facing the top of a compliant uniform rod and the proximate primary or secondary protrusion of the first contact element.

A compliant element, usually a uniform rod, typically with a square or rectangular cross section, is positioned within the channel of the housing and within the opening formed by the oblique surface of the second contact element, the primary and secondary protrusions and the base of the first contact element.

The first contact element has a contact surface facing away from the first surface. Additionally, the first contact element's contact surface is generally comprised of a base that faces the load board. This contact surface could be flat or comprised of nubs generally along the length of the base typically making contact with a least one trace on a load board.

The second contact element's contact surface is generally located of the end of the bar that faces the device leads and away from the second surface. This contact surface could be flat or comprised of at least one nub usually making contact with the device leads.

The second contact element's generally vertical tail surface opposite facing the oblique surface makes an internal contact with the proximate first contact element's protrusion. The angle of second contact element's oblique surface is such that it creates a bias for this aforementioned internal contact surface.

When the first contact element is engaged with a generally firm immovable surface such as a load board, the said second contact element responds to a downward force applied to its external contact surface, usually by a device lead, by the oblique surface pressing onto the compliant element. Due to the angle of the oblique surface the second contact's contact surface is urged to translate along the device lead in a direction that is the same side where the oblique surface is facing in the horizontal direction. When this downward force is removed, the return of the compliant element to its original shape urges the second contact element back to its approximate initial position.

An important feature of the invention is the self-cleaning translational scrub on the second contact's external contact surface on the device lead so that there is reliable contact and low and stable contact resistance even with intermittent debris or contamination. Another important feature is the vertical translation of the second contact element's tail surface so that it rubs against the proximate primary or secondary protrusion of the first contact element. This prevents and eliminates debris buildup between these surfaces. Still another important feature is the expansion space at the opening of the first channel so that an inward force upon the compliant element does not cause the housing to bow away from the load board, thereby further ensuring contact between usually the device lead and the load board. In addition, the first contact element is generally securely positioned within the housing hole so there is no lateral translation and therefore preventing load board trace wear.

Another prior art invention has a contact element that is suspended between two elastomeric elements. The rolling of the contact element onto the load board minimizes contact pad wear but any slight slippage on the load board pad surface could still create wear due to the contact element's abrasion to the load board. Another concern would be debris entering in-between the contact element and the load board and embed itself due to the rolling area of the contact element. Additional concern would be the upward bulge of the two elastomeric elements during device actuation causing upward housing bow and compromising the contact element's bias to the load board.

DETAILED DESCRIPTION

Figure 1:
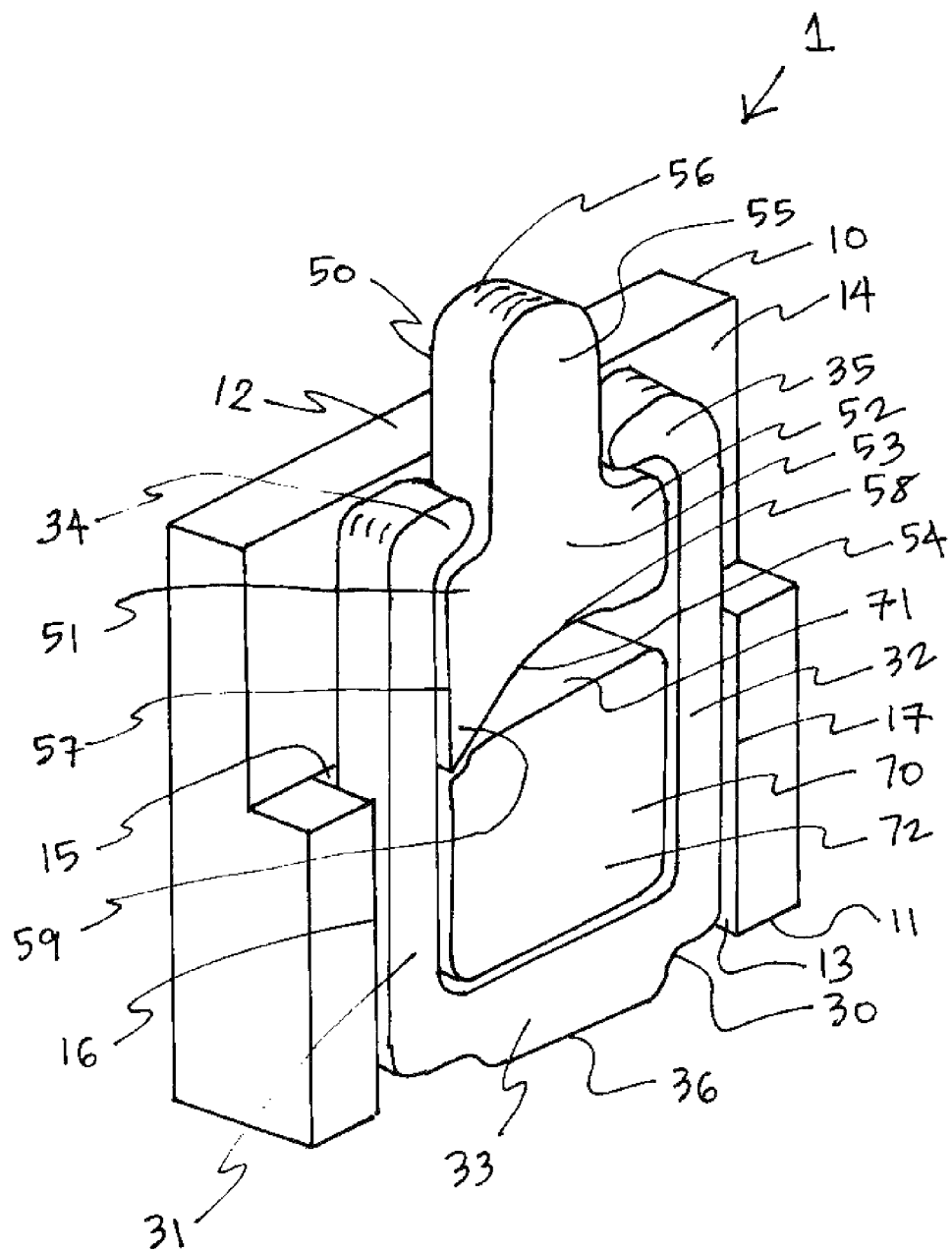
FIG. 1 illustrates a preferred embodiment of the invention, a half-sectioned view of two contact elements and a compliant rod within the housing.
Figure 2:
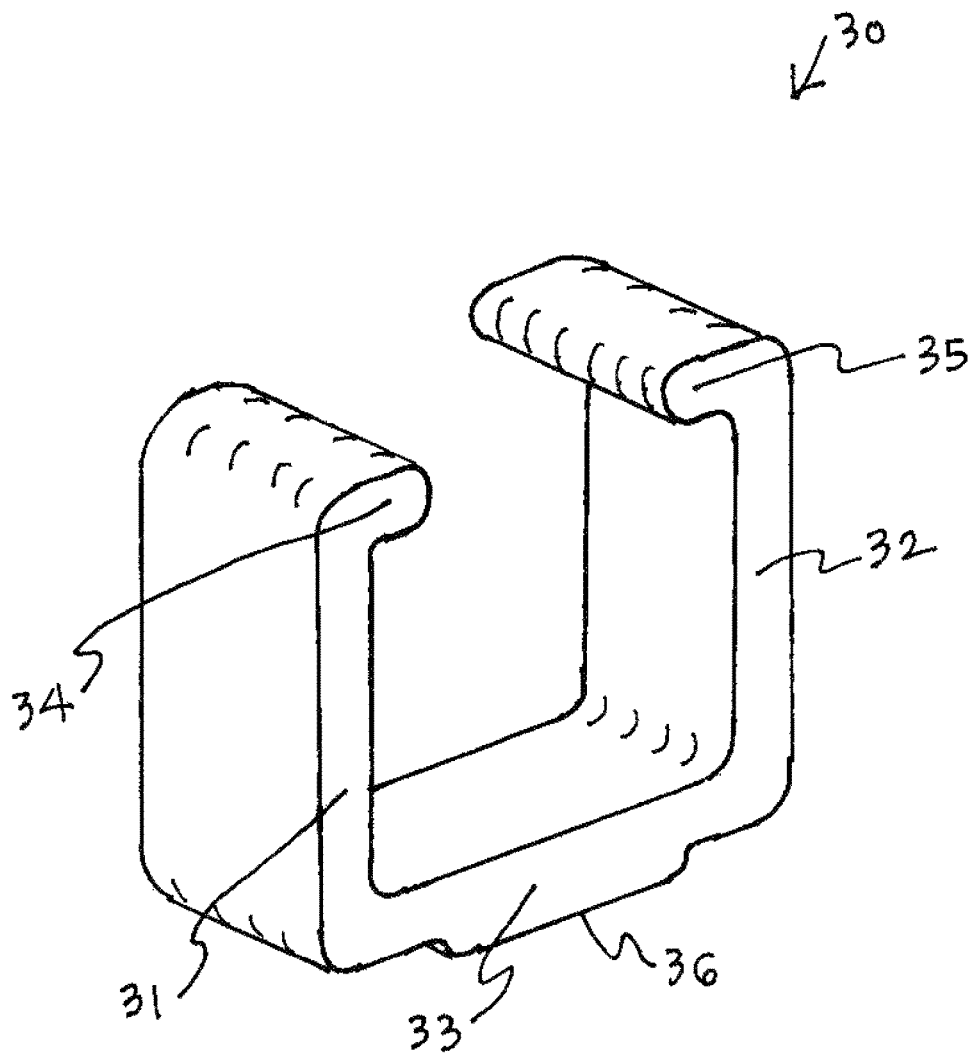
FIG. 2 illustrates the first contact element.
Figure 3:
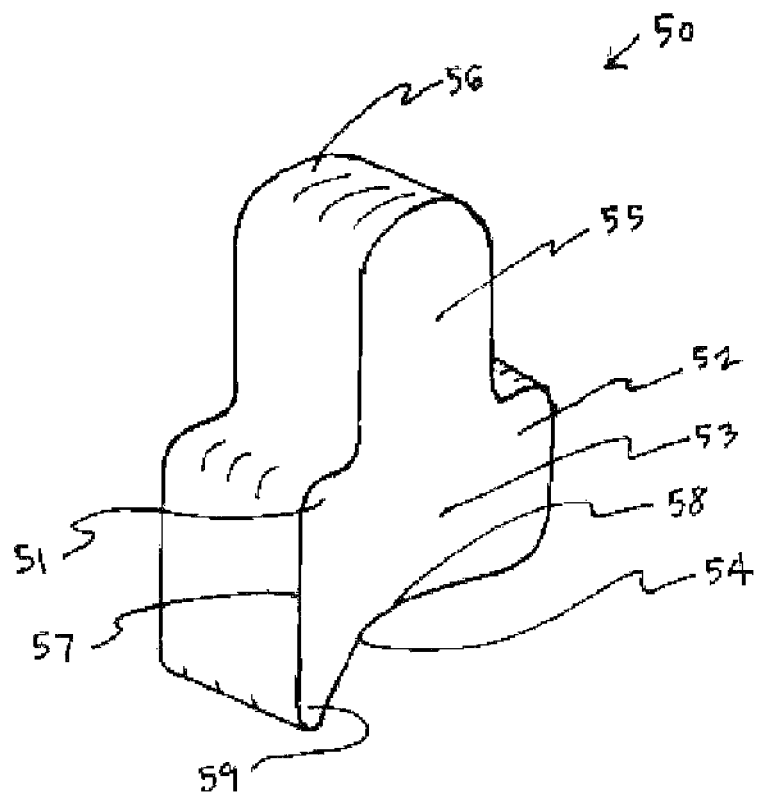
FIG. 3 illustrates the second contact element.
Figure 4:
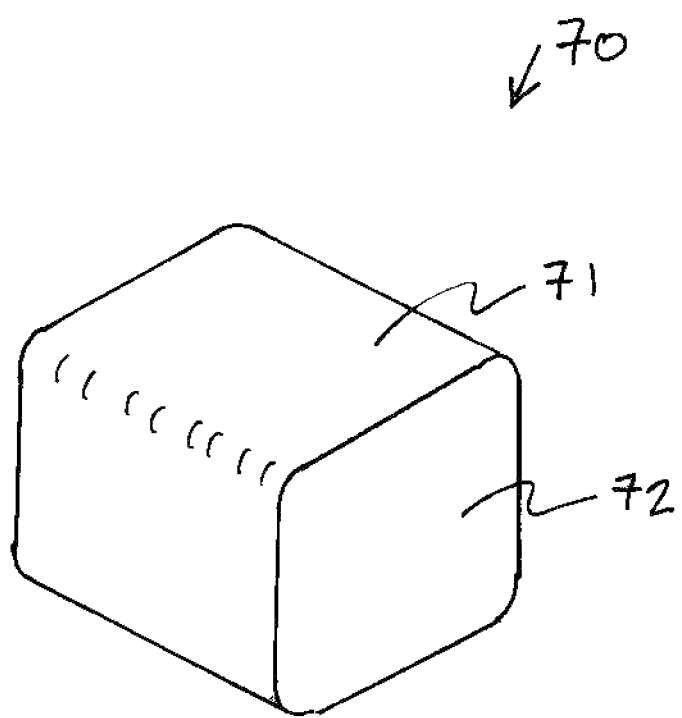
FIG. 4 illustrates the compliant element.
Figure 5:
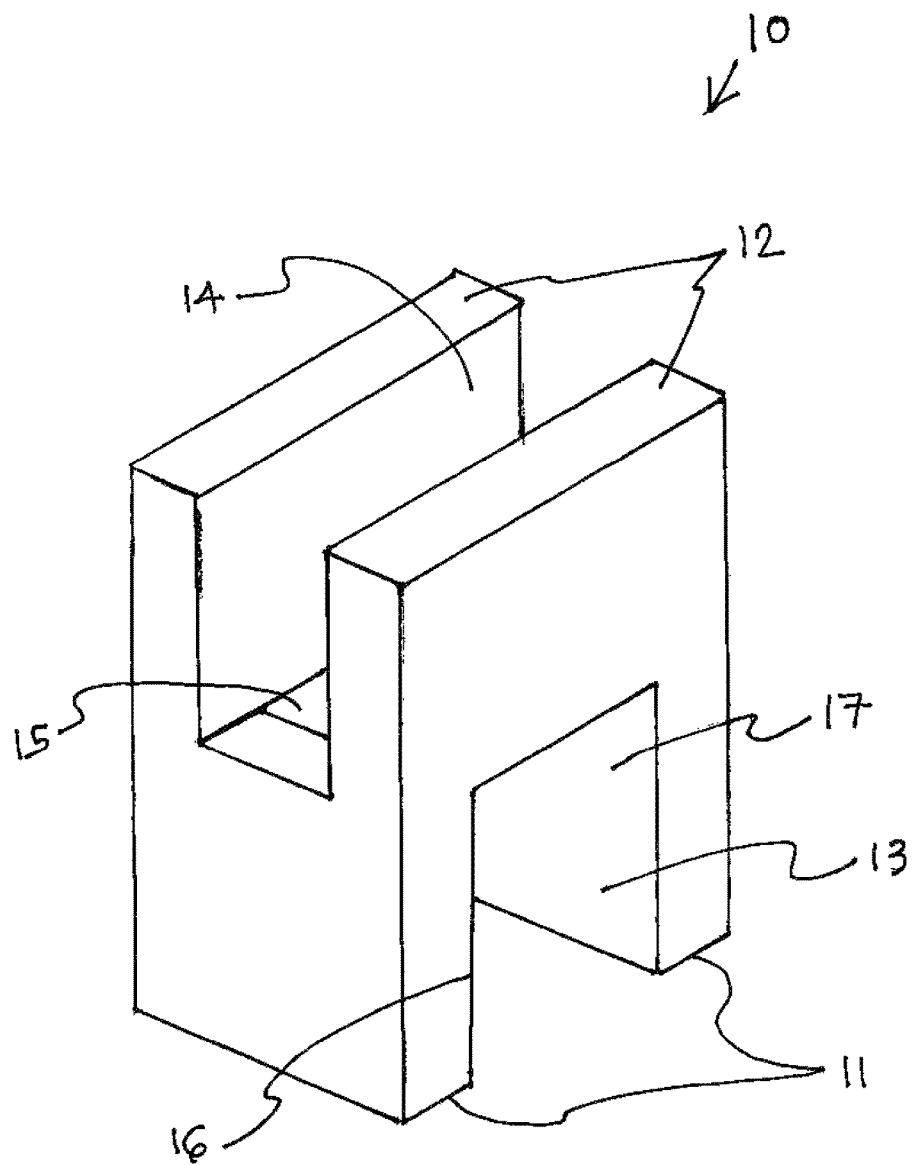
FIG. 5 illustrates the housing without the section cut.

Various embodiments are described hereinafter with reference to the figures. The figures are not drawn to scale and those elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment does not need to have all the aspects or advantages shown. An aspect or an advantage described in conjunction with a particular embodiment is not necessarily limited to that embodiment and can be practiced in any other embodiments even if not so illustrated.

This invention utilizes a forward scrubbing action which induces regular self-cleaning and reduction in contact tip wear rate. There is prior art that also does this dynamic motion but they do not have the additional advantages of this proposed invention such as minimal housing bow, vertical alignment of the device leads to the load board pads and no wear of the load board.

The invention also prevents debris from affecting inside the internal contact surfaces by creating a rubbing action between these surfaces, and therefore cleans off any debris that enters inside the contacts.

Housing bow is minimized because the contact is not reliant on the pre-load bias of the elastomer on the housing to contact the load board, which causes housing to bow. Instead it is reliant on the direct force of the device under test without relying on the housing for bias. In addition, the compliant element has sufficient expansion space to expand, which also minimizes housing 10 bow.

The design is specially made so the device leads and the load board pad are vertically aligned, instead of contacting the load board pad with an outward offset, such as with prior arts. This has the advantage of allowing the load board designer to install closer components to the test site and therefore minimize signal distortion.

The invention also has the advantage of minimizing load board wear by eliminating translation on the load board. In a rolling type of contact, the surface that mates with the load board may rub against the load board pad surface instead of just rolling especially in a situation where the housing is bowed away from the load board due to warp. This warp is due to the loss of bias to the load board that can occur after thousands of devices are tested.

This invention proposes contact elements biased by an elastomeric element that are configured to provide a relatively stable and low contact resistance, cleans debris in-between the internal contact surfaces, prevents the housing's upward bow and prevent load board wear.

FIG. 1 illustrates the preferred embodiment of the invention. The invention provides reliable electrical contact between the leads of the semiconductor and a testing board. In FIG. 1, a cross section of the housing is shown along the length of the slot to show the internal components 10, 30, 50, 70. The removed part of the section is symmetrical to what is shown in FIG. 1. The contact device consists of an electrical connector 1 consisting of a housing 10 usually made of relatively insulative plastic or an equivalent material, which is typically positioned between the circuit traces of a load board and the device lead (not shown). The housing 10 consists of two parallel first surfaces 11 with one side touching the device leads. The housing also has two parallel second surfaces 12 perpendicular to the first surfaces. The housing 10 has a first channel 13 usually a rectangular or square cut that extends from the first opposed surface 11 towards the second opposed surface 12 approximately halfway through the housing 10, with the opening facing the first surface 11 of the housing 10, generally at the proximity of the circuit terminals of the load board. In addition, the housing has a second channel 14 perpendicular from the first channel 13 and is usually a rectangular or square cut with a depth approximately half the distance from the second surface 12 towards the first surface 11 generally halfway through the housing 10, with the opening facing the second surface 12 of the housing 2, generally at the proximity of the device leads. The first 13 and second 14 channel's depth of cut into the housing 10 is such that a square or rectangular hole 15 is produced where they meet. The depth of the first channel 13 is at least thirty (30) to seventy (70) percent of the height of the housing 10.

The first 13 and second 14 channel maybe manufactured by a milling machine process with qualities depending on the resulting dimensional tolerances, manufacturing efficiencies and costs. The width of the first 13 and second 14 channel are based on the respective widths of the first 30 and second 50 contact elements such that the two contact elements 30 and 50 would be able to slide freely within the two channels 13 and 14.

In addition, there is a first contact element 30, generally, made of copper or other conductive material that can be machined to an approximate U-shape from a flat plate. The first contact element 30 fits into the hole 15 and forms base 33 at the bottom of the first channel 13, proximate the first surface 11. The first contact element 30 having a primary protrusion 31, directed inward, generally perpendicular to the base 33 and parallel to a proximate wall 16 of the first channel 13. Furthermore, the first contact element's 30 base 33 has a secondary protrusion 32 that originates from the opposite end of the base 33, extending generally parallel to the primary protrusion 31 and parallel to its respective proximate wall 17 of the first channel 13. The ends of the primary 31 and secondary protrusions 32 both have inward flanges 34, 35 that function as retention features for the second contact element 50. The first contact element 30 fits and is generally secured within the housing channels 13, 14 to prevent translation onto the load board which can cause load board wear.

There is a second contact element 50 made of conductive material generally made of copper or other conductive material, shaped similar to a bar 55 with a generally trapezoidal tail 53 that fits into primary 31 and secondary 32 protrusions of the first contact element 30, proximate the second surface 12. In this embodiment, the top portion of the second contact element is round either half cylindrical or half spherical, but other shapes are possible such as having a V-channel depending on the contact tip dynamics desired for the device package type tested. The lower tail 53 portion of the said second contact element 50 has outward flanges 51 and 52 that generally mates into the respective flanges 34 and 35 of the first contact element 30 so as to function as a retention feature for the second contact element 50. The outward flanges 51 and 52 may have rounded corners to allow for easy assembly of the second contact element from the first contact element 30. Furthermore, the second contact element 50 has an oblique surface 54 facing the top 71 of the compliant uniform rod 70 and the proximate primary 31 or secondary 32 protrusions of the first contact element 30. The oblique surface 54 maybe inward curved 58 with an acute tip 59 angle that can be anywhere from 20 to 45 degrees, depending on the force deflection and forward self-cleaning scrub action desired of the contact surface 56. The oblique surface 54 of the second contact element 50 along with the round top contact surface 56 allows the forward scrub self-cleaning action to minimize the debris build up in-between the contact element and the device-under-test.

A generally insulative compliant element 70 usually a uniform rod that could be made of rubber, typically with a square or rectangular cross section 72 is positioned within the first channel 13 of the housing 10. The length and width of the square or rectangular cross section 72 approximately conforms to the opening composed of the oblique surface 54 of the second contact element 50, the primary 31 and secondary 32 protrusions and the base 33 of the first contact element 30. The compliant element 70 retains the other components by friction.

As can be seen from FIG. 1, housing 10 bow is minimized because the first contact element 30 is not completely reliant on the pre-load bias of the compliant element 70 on the housing to contact the load board, which causes the housing 10 to bow. Instead it is reliant on the direct force of the device-under-test without completely relying on the housing for bias. In addition, the first channel 13 has sufficient expansion space for the compliant element 70 to expand, which also minimizes housing 10 bow.

The length of both the primary 31 and secondary 32 protrusions of the first contact element 30 are generally equal and contains the sum of the heights of the compliant element 70 and the second contact element's 50 tail portion of the trapezoid 53.

The total height of the first contact element 30 can be equal to the housing's perpendicular distance from the first surface 11 to the second surface 12.

The total height of the second contact element 50 is such that the bar's 55 contact surface 56 protrudes above the second surface 12 when the compliant element 70 is not actuated. The compliant element 70 is actuated when the device-under-test compresses the second contact element from the top and causing the second contact element 50 to pivot at the acute tip 59 and compress the compliant element 70.

The first contact element 30 has a contact surface 36 facing away from the second contact element's 50 contact surface 56. Additionally, the first contact element's 30 contact surface 36 is generally comprised of the base 33 that faces the load board. This contact surface 36 could be flat or comprised of nubs generally along the length of the base 33 typically making contact with a least one trace on the load board (not shown).

The second contact element's 50 contact surface 56 is generally located of the end of the bar 55 that faces the device leads and away from the second surface 12. This contact surface 56 could be flat or comprised of at least one nub usually making contact with the device leads.

The second contact element 50 makes contact with the first contact element 30 at its generally vertical tail surface opposite the oblique surface 54. Additionally, in the un-actuated position, the first contact element's inward flanges 34 and 35 makes contact with the second contact element's outward flanges 51 and 52 respectively, this is maintained by the preload force of the compliant element 70.

In the un-actuated position, the outward flanges 51, 52 of the second contact element 50 engages the inward flanges 34, 35 of the first contact element 30. The compliant element 70 generally keeps the two components 30, 50 in place by preload. When the first contact element's 30 contact surface is engaged with an immovable surface such as a load board, the said second contact element 50 responds to a downward force applied to its contact surface 56, usually by a device lead, by its oblique surface 54 pressing onto the top 71 of the compliant element 70. Due to the angle of the oblique surface, 54 the second contact element's 50 contact surface 56 moves along the device lead in a horizontal and downward direction that is the same side where the oblique surface 54 is facing. When the downward force is removed, the compliant element 70 returns to its original shape causing the second contact element 50 back to its approximate initial position wherein the outward flanges 51, of the second contact element 50 generally mates with the inward flanges 34, 35 of the first contact element 50 respectively.

All examples and conditional language recited herein are intended for educational purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents hereof. Additionally, it is intended that such equivalents include both currently known equivalents as well as equivalents developed in the future, i.e., any elements developed that perform the same function, regardless of structure.

The invention claimed is:

1. An electrical contact device consisting of: an insulative housing with two parallel first surfaces with a bottom portion of the first surfaces touching the surface of a load board and said housing having two parallel second surfaces that are perpendicular to and spaced relative to the housing's first surfaces; said housing having at least one channel with a depth halfway up the first surfaces from the load board relative the second surfaces of the housing with an opening facing the first surfaces; said housing having a second channel that is crosswise from the first channel and with a depth approximately halfway down the second surface relative the first surface of the housing with the opening facing the second surface; said first and second channels are cut, so together they form a generally rectangular hole where they meet; a first contact element made of conductive material that fits into the housing wherein said first contact element having a primary protrusion perpendicular to a base and parallel to a wall of the housing and wherein said base having a secondary protrusion that originates at the opposite end of the base, parallel to the primary protrusion and parallel to the wall of the housing and said ends of the primary and secondary protrusions have inward flanges; a second conductive contact element that fits into a top opening of the first contact element wherein a lower part of said second contact element having a tail with outward flanges which are wider than a top portion and mates within said flanges of the first contact element, furthermore, said second contact element's tail having an oblique surface facing a top of an insulative compliant element; and the insulative compliant element is shaped as a square or rectangle positioned below said second contact element within said first contact element; the insulative compliant element retaining the other components by friction.

2. The connector of claim 1, wherein the oblique surface of the second contact element is curved inward.

3. The connector of claim 1, wherein the outward flanges of the second contact element are rounded.

4. The connector of claim 1, wherein the first conductive contact element's base has a nub that extends outward and generally engages traces of a load board.

5. The connector of claim 1, wherein the second conductive element's member has a nub that extends outward and engages device leads.

6. The connector of claim 1, wherein the oblique surface of the second contact element has an angle between 20 degrees and 45 degrees.

7. The connector of claim 1, wherein first contact element is made of copper.

8. The connector of claim 1, wherein second contact element is made of copper.

9. The connector of claim 1, wherein a height of the first contact element is the same as the housing and a width of said first contact element fills a space between second contact surfaces.

10. The connector of claim 1, wherein said insulative compliant element has a width thicker than a surface of second contact surfaces, with a height less than an opening of the first channel.

11. The connector of claim 1, wherein said insulative compliant element has a height between 40 percent to 70 percent of an inner height of said first contact element.

12. The connector of claim 1, wherein a height of said first channel is between 40 percent to 70 percent of a height of said housing.

* * * * *